United States Patent
Mitchell et al.

(10) Patent No.: US 7,245,786 B2
(45) Date of Patent: Jul. 17, 2007

(54) FILTERING ARTIFACT FROM FMRI DATA USING THE STOCKWELL TRANSFORM

(75) Inventors: J. Ross Mitchell, Calgary (CA); T. Chen Fong, Calgary (CA); Bradley G. Goodyear, Calgary (CA); Hongmei Zhu, Calgary (CA)

(73) Assignee: 976076 Alberta Inc., Calgary, Alberta (CA)

( * ) Notice: Subject to any disclaimer, the term of this patent is extended or adjusted under 35 U.S.C. 154(b) by 874 days.

(21) Appl. No.: 10/430,204

(22) Filed: May 7, 2003

(65) Prior Publication Data

US 2003/0210047 A1 Nov. 13, 2003

Related U.S. Application Data (60) Provisional application No. 60/378,963, filed on May 10, 2002.

(51) Int. Cl.
- G06K 9/36 (2006.01)
- G01V 3/00 (2006.01)
- A61B 5/05 (2006.01)

(52) U.S. Cl. ........................ 382/280; 324/307; 600/410

(58) Field of Classification Search ................ 382/260, 382/264, 275, 276, 280; 324/307–309, 312–314, 324/318; 600/410; 702/75–77; 375/254
See application file for complete search history.

(56) References Cited

U.S. PATENT DOCUMENTS

| | | | |
|---|---|---|---|
| 4,723,166 A * | 2/1988 | Stratton | 348/620 |
| 5,891,047 A * | 4/1999 | Lander et al. | 600/516 |
| 2004/0097802 A1 * | 5/2004 | Cohen | 600/411 |

OTHER PUBLICATIONS

Mansinha et al., "Local S-spectrum Analysis of 1-D and 2-D Data", Physics of the Earth and Planetary Interiors, Elsevier Science B.V., No. 103, pp. 329-336, 1997.

Stockwell et al., "Localization of the Complex Spectrum: The S Transform", IEEE Transactions on Signal Processing, IEEE, vol. 44, No. 4, Apr. 1996.

* cited by examiner

Primary Examiner—Kanjibhai Patel
(74) Attorney, Agent, or Firm—Freedman & Associates (57) ABSTRACT

The present invention relates to a method for filtering time-varying MR signal data prior to image reconstruction. A one-dimensional FT is applied to the time-varying MR signal data along each frequency-encode line of k space. The phase p of each complex pair (R, I) of the FT transformed data is calculated to create a phase profile for each frequency-encode line. This process is repeated for all time points of the time-varying MR signal data. The time course of each point within the phase profile is then transformed into Stockwell domain producing ST spectra. Frequency component magnitudes indicative of an artifact are determined and replaced with a predetermined frequency component magnitude. Each of the ST spectra is then collapsed into a one-dimensional function. New real and imaginary values (R', I') of the complex Fourier data are calculated based on the collapsed ST spectra which are transformed using one-dimensional inverse Fourier transformation for producing filtered time-varying MR signal data. The method for filtering time-varying MR signal data is highly advantageous by easily identifying high-frequency artifacts within the ST spectrum and filtering only frequency components near the artifacts. Therefore, high-frequency artifacts are substantially removed while the frequency content of the remaining signal is preserved, enabling for example detection of subtle frequency changes occurring over time.

26 Claims, 8 Drawing Sheets

FILTERING ARTIFACT FROM FMRI DATA USING THE STOCKWELL TRANSFORM

This application claims benefit from U.S. Provisional Application No. 60/378,963 filed May 10, 2002.

FIELD OF THE INVENTION

This invention relates to magnetic resonance imaging systems and in particular to a new signal processing method for filtering transient noise from fMRI data using the Stockwell transform.

BACKGROUND OF THE INVENTION

Magnetic resonance imaging (MRI) provides a powerful tool for non-invasive imaging for treatment assessment and for minimally invasive surgery. The contrast sensitivity of the MRI provides a capability of non-invasively revealing structures and functions of internal tissues and organs not known to other imaging techniques such as, for example, CT scan or Ultrasound.

Physiological fluctuations are a common source of artifacts and noise in medical imaging. These fluctuations are typically manifested as phase shifts in the collected MR signal and as variations in the resonant frequency. Due to relatively slow collection of image data in phase-encode direction Gradient-Recalled Echo Echo Planar Imaging (GRE-EPI) is especially susceptible to these phenomena. MR phase variations during image collection cause ghosting artifacts in the phase-encode direction of a reconstructed EPI image which possibly overlaps with anatomical regions of interest. A first step in correcting the phase of the MR signal is to collect a reference EPI scan prior to the imaging sequence with no phase-encoding gradient, and to register the phase of subsequent raw image data to that of the reference scan before reconstructing the image data into images as taught in: Schmitt F., Wielopolski P. A., "Echo-planar image reconstruction", in: Schmitt F., Stehling M. K., Turner R., editors, "Echo-planar imaging: theory, technique, and application", Berlin, Springer Verlag, 1998, 141–178, herein incorporated by reference. Hence, this technique corrects for phase accrual during the collection of image data. This technique is standard for most EPI applications. However, if imaging planes are located in areas of high magnetic susceptibility causing phase distortions in both the reference scan and the image data, ghosting artifacts and geometric distortions still remain.

In imaging sessions where multiple scans are collected over time, as in functional magnetic resonance imaging (fMRI), phase distortions in the MR signal occur due to physiological fluctuations between images taken such as sudden head motion or changes in respiration. The removal of artifacts resulting from these fluctuations is of particular importance in fMRI since data analysis techniques rely on the variation of image pixel intensity to identify, for example, brain regions involved in a specific task. Image artifacts have placed limitations on numerous studies of brain activation using fMRI. For example, the majority of studies involving language have relied on the mental generation of words rather than speech production due to artifacts that accompany jaw movements and the resonating oral cavity. Some fMRI studies have attempted speech production by designing post-processing strategies to remove motion artifacts as disclosed in: Huang J., Carr T. H., Cao Y, "Comparing cortical activations for silent and overt speech using event-related fMRI", Hum Brain Mapp., 2002, 15, 39–53, herein incorporated by reference. However, movements occurring outside the imaging field lead to MR phase fluctuations giving rise to magnitude artifacts in the reconstructed images, especially for images taken near face and jaw. Existing motion correction techniques are not capable of correcting these artifacts since rigid motion of the brain is not the result of the artifact. In this case, false positive activations occur or significant brain activity is missed depending on the manifestation of the artifact.

A common technique to correct for time-varying fluctuations in data phase is to use a navigator echo scheme as disclosed in: Hu X., Kim S. G., "Reduction of signal fluctuation in functional MRI using navigator echoes", Magn. Reson. Med., 1994, 31, 495–503, herein incorporated by reference. A navigator echo is an additional line of k space, i.e. at $k_y=0$, collected after each RF pulse. This echo is used to monitor changes of the phase at the beginning of each image collection due to physiological fluctuations such as respiration. Essentially, the correction is based on registering the phase of the $n^{th}$ image raw data set to the reference phase of the first image using the phase of the $n^{th}$ navigator echo. Although this method improves image quality, ghosting artifacts remain due to inaccuracies in tracking the distortions in phase.

Another method for correcting physiological fluctuations is based on the use of retrospective modeling of the cardiac and/or respiratory cycles using data collected from physiological monitoring devices in the MR environment as disclosed in:

Hu X., Le T. H., Parrish T., Erhard P., "Retrospective estimation and correction of physiological fluctuation in functional MRI", Magn. Reson. Med., 1995, 34, 201–212;

Glover G. H., Li T. Q., Ress D., "Image-based method for retrospective correction of physiological motion effects in fMRI: RETROICOR", Magn. Reson. Med., 2000, 44, 162–167; and, Chuang K. H., Chen J. H., "IMPACT: Image-based physiological artifacts estimation and correction techniques for functional MRI", Magn. Reson. Med., 2001, 46, 344–353, herein incorporated by reference. The benefit of this method is that imaging sessions are not lengthened by the need for collecting extra data for phase correction.

In addition to these methods aimed at reducing physiologically-induced artifacts before images are reconstructed, methods based on image pixel intensity fluctuation have been developed for removing artifacts after images have been reconstructed as disclosed in:

Glover G. H., Li T. Q., Ress D., "Image-based method for retrospective correction of physiological motion effects in fMRI: RETROICOR", Magn. Reson. Med., 2000, 44, 162–167; and, Chuang K. H., Chen J. H., "IMPACT: Image-based physiological artifacts estimation and correction techniques for functional MRI", Magn. Reson. Med., 2001, 46, 344–353, herein incorporated by reference. Here, a time course of reconstructed image pixel intensity is processed using a one-dimensional Fourier transform (FT) to determine the average magnitude of the frequency components within the time course. Filtering of unwanted frequencies is achieved, for example, by multiplying the resulting frequency spectrum with a band pass filter such as a Hamming window that is unity at frequencies to be maintained and zero at unwanted frequencies. However, special care has to be taken at the data analysis stage after such filtering, since assumptions regarding temporal autocorrelations within the data are changed and, therefore, statistical tests have to be modified accordingly. The major limitation of this method is that the filter is applied over the entire time course of the experiment and not just at the time when the artifact source occurs. This is of concern in cases when the frequency content of the signal is important in data analysis. One approach to overcome this limitation is based on using Short-Time window FT (STFT). However, subtle changes in frequency are missed if the window width is insufficient in resolution. Hence, a priori knowledge of the frequency content of the signal is required.

SUMMARY OF THE INVENTION

It is, therefore, an object of the invention to provide a method for filtering transient noise from fMRI data based on the Stockwell transform.

It is further an object of the invention to provide an automated method for filtering transient noise from fMRI data without a priori knowledge of the frequency content of the MRI signal.

It is yet further an object of the invention to provide a method for filtering transient noise from fMRI data capable of significantly reducing image ghosts resulting from phase distortions occurring due to motion outside an imaging field.

The ST filtering method according to the invention provides an automated technique for filtering unpredictable phase fluctuations from fMRI data sets and, therefore, permits fMRI in the presence of motion occurring outside the imaging field offering exploration of cortical processes with overt speech components as well as swallowing. Further, the ST filtering method improves data sets collected while a subject's hands and arms are moved near the head such as in reaching and pointing experiments.

In accordance with the present invention there is provided a method for filtering transient noise comprising the steps of:
receiving time-varying signal data indicative of an image of an object;
determining a ST spectrum of frequency component magnitude vs. time by S transforming the time-varying signal data;
determining a median magnitude of each frequency component over time;
determining frequency locations in time where the frequency component magnitude exceeds a predetermined threshold;
determining artifact regions as regions extending from the locations where the frequency component magnitude exceeds the predetermined threshold to locations where the frequency component magnitude approximately equals the median magnitude;
replacing the magnitudes of the frequency components within the artifact regions with the median magnitude of the respective frequency component;
collapsing the ST spectrum into a lower-dimensional function producing a Fourier spectrum of the filtered time-varying signal by summing the magnitude of each frequency component over time; and,
inverse Fourier transforming the filtered Fourier spectrum producing filtered time-varying signal data.

In accordance with the present invention there is further provided a method for filtering transient noise comprising the steps of:
receiving time-varying signal data indicative of an image of an object;
determining a ST spectrum of frequency component magnitude vs. time by S transforming the time-varying signal data;
determining frequency component magnitudes indicative of an artifact;
replacing the frequency component magnitudes indicative of an artifact with a predetermined frequency component magnitude;
collapsing the ST spectrum into a lower-dimensional function producing a Fourier spectrum of the filtered time-varying signal data; and,
inverse Fourier transforming the filtered Fourier spectrum producing ST filtered time-varying signal data.

In accordance with an aspect of the present invention there is provided a method for filtering time-varying MR signal data comprising the steps of:
receiving the time-varying MR signal data indicative of an image of an object;
performing for a plurality of different time instances of the time-varying MR signal the steps of:
one-dimensional Fourier transforming the time-varying MR signal data along frequency-encode-lines of k space producing complex pairs (R, I) of Fourier transformed data;
determining from each complex pair (R, I) a phase p for generating a phase profile for the respective frequency-encode line;
producing time courses for respective points of the phase profile;
determining respective ST spectra of frequency component magnitude vs. time by S transforming each of the time courses;
determining frequency component magnitudes indicative of an artifact;
replacing the frequency component magnitudes indicative of an artifact with a predetermined frequency component magnitude;
collapsing each of the ST spectra into a lower-dimensional function producing a Fourier spectrum of the filtered time-varying signal data; and,
inverse Fourier transforming the filtered Fourier spectrum producing filtered time-vary phase profile;
determining new complex pairs (R', I') based on the ST filtered phase time courses; and,
one-dimensional inverse Fourier transforming the new complex pairs producing filtered time-varying MR signal data.

In accordance with the aspect of the present invention there is further provided a system for filtering time-varying MR signal data comprising:
a storage medium having executable commands for execution on at least a processor stored therein, the at least a processor when executing the commands performing the steps of:
receiving the time-varying MR signal data indicative of an image of an object;
performing for a plurality of different time instances of the time-varying MR signal the steps of:
one-dimensional Fourier transforming the time-varying MR signal data along frequency-encode-lines of k space producing complex pairs (R, I) of Fourier transformed data; and, determining from the complex pairs (R, I) a phase profile for the respective frequency-encode lines;
producing time courses for respective points of the phase profile;
determining a ST spectrum of frequency component magnitude vs. time by S transforming the time courses;
determining frequency component magnitudes indicative of an artifact;

replacing the frequency component magnitudes indicative of an artifact with a predetermined frequency component magnitude;

collapsing the ST spectrum into a lower-dimensional function producing a Fourier spectrum of the filtered time courses; and, inverse Fourier transforming the filtered Fourier spectrum producing filtered time-varying phase profiles;

determining new complex pairs (R', I') based on the ST filtered phase time courses; and, one-dimensional inverse Fourier transforming the new complex pairs producing filtered time-varying MR signal data;

a port for receiving the time-varying MR signal data; and, at least a processor in data communication with the port and the storage medium, the processor for executing the executable commands for processing the time-varying MR signal data.

BRIEF DESCRIPTION OF THE FIGURES

Exemplary embodiments of the invention will now be described in conjunction with the following drawings, in which:

FIG. 4b is a simplified block diagram illustrating a system for implementing the filtering method according to the invention shown in FIG. 4a;

DETAILED DESCRIPTION OF THE INVENTION

The method for filtering transient noise from fMRI data according to the invention is based on the Stockwell Transform (ST). The ST has been recently introduced in geophysics and is disclosed in: Stockwell R. G., Mansinha L., Lowe R. P., "Localization of the complex spectrum: the S-transform", IEEE Trans. Signal Process, 1996; 44, 998–1000, and in: Mansinha L., Stockwell R. G., Lowe R. P., Eramian M., Schincariol R. A., "Local S-spectrum analysis of 1-D and 2-D data", Phys. Earth Plan. Interiors, 1997; 103, 329–336, which are incorporated herein by reference.

In the following it will become apparent to those of skill in the art that the method for filtering transient noise from fMRI data according to the invention disclosed hereinbelow is not limited to processing of fMRI signal data only but is applicable for processing of a wide range of time-varying imaging signal data. Furthermore, it will become apparent from the explanation below that the method for filtering transient noise data according to the invention is presented in one-dimensional form for simplicity, but is also applicable for the processing of multi-dimensional time-varying signal data as well.

The ST of a one-dimensional signal in time, $f(t)$, is a two-dimensional function in time and frequency, namely, $$S(\tau, v) \equiv S\{f(t)\} \quad [1]$$

$$= \int_{+\infty}^{-\infty} f(t) w_S\left(\frac{t-\tau}{\frac{1}{|v|}}\right) \exp(-2\pi i t v) dt$$

$$= F_t\{f(t) \cdot w_S((t-\tau), v)\}.$$

The localizing time window $w_S$ is, for example, a Gaussian function having a frequency dependent window width:

$$w_S((t-\tau), v) = \frac{|v|}{\sqrt{2\pi}} \exp\left(-\frac{(t-\tau)^2 v^2}{2}\right). \quad [2]$$

In effect, the window width is scaled by a function that is inversely proportional to the temporal frequency analogous to a Gaussian distribution with $\sigma = \sigma(v) = 1/|v|$. As a result, narrower windows are used at higher frequencies and wider windows are used at lower frequencies. These characteristics enable detecting subtle frequency changes occurring over time which are likely missed using prior art filtering methods.

Figure 1:
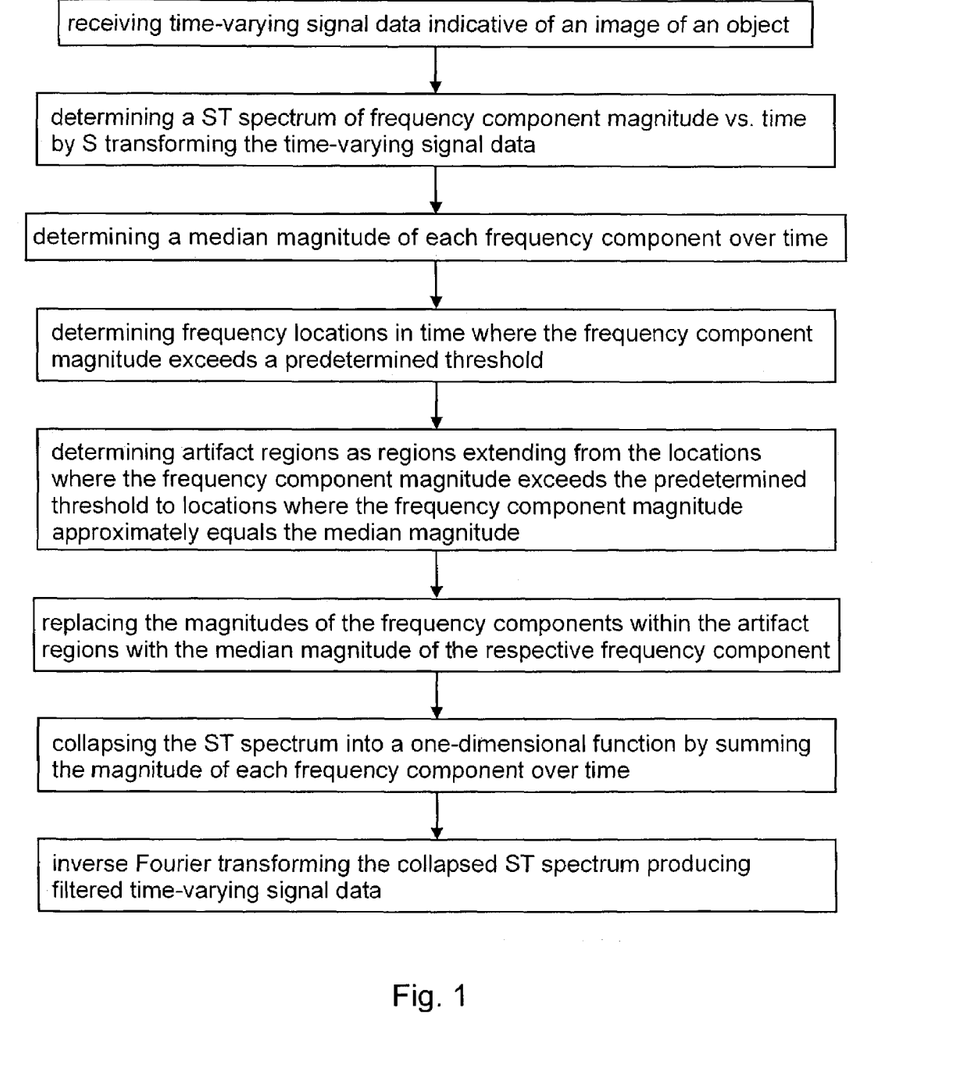
FIG. 1 is a simplified flow diagram of a method for filtering transient noise according to the invention.

Referring to FIG. 1, a first embodiment of a method for filtering transient noise according to the invention is shown. A time-varying signal is first subjected to the ST to obtain a 2D spectrum of frequency component magnitude vs. time. A median magnitude of each frequency component over time including artifacts is then calculated and frequency locations in time are labeled as frequency artifacts when the magnitude exceeds a predetermined threshold. Experiments have revealed a value of three times the median as being a good indicator of frequency artifacts in phase time courses of fMRI signals. Normally, artifact frequencies do not occur discretely but appear as artifact regions—blotches or smears—in the ST spectrum. Hence, artifact regions are taken to extend from the location where the frequency component magnitude exceeds the threshold to a location where the frequency component magnitude approximately equals the median. This successfully encompasses the artifact. The magnitudes of the frequency components within the artifact regions are replaced with the median magnitude of the respective frequency component. As is evident, numerous other methods for defining artifact regions and replacing frequency magnitudes are also applicable. The magnitude of each frequency component is then summed over all time indices of the ST spectrum, thus collapsing the ST spectrum to the one-dimensional Fourier spectrum of filtered time-varying signal. Using inverse Fourier Transformation (FT) a filtered time-varying signal is obtained from the filtered Fourier spectrum, i.e., the collapsed ST spectrum. The above filtering process is repeated for each time-varying signal such as time-varying signals indicating image pixel intensity changing in time—called an image pixel time course—of an imaging process prior image reconstruction.

Figure 2A:
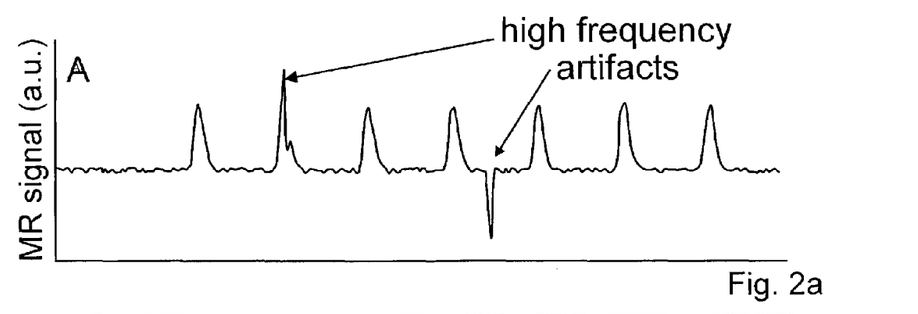
FIGS. 2a to 2d are diagrams illustrating the ST filtering process of the method shown in FIG. 1.
Figure 2B:
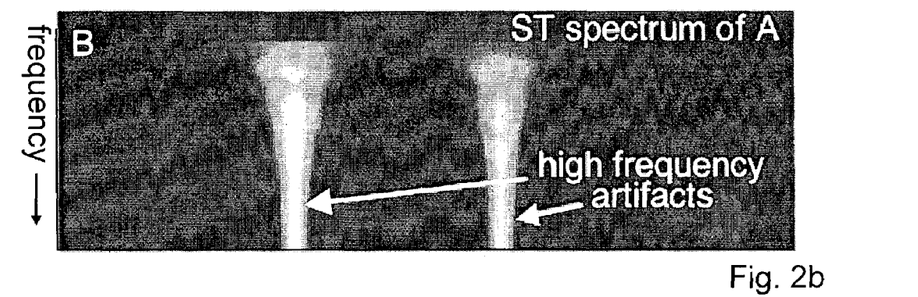
Figure 2C:
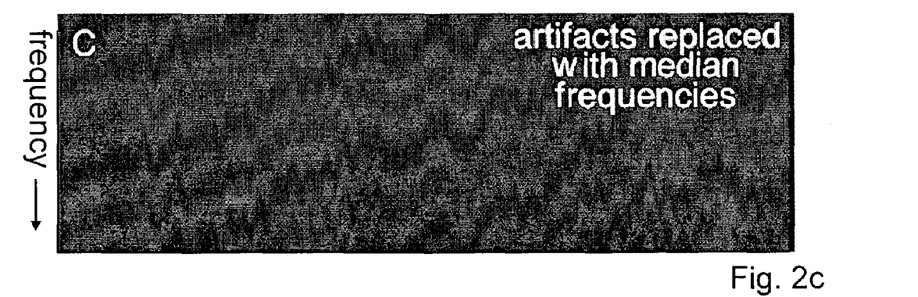
Figure 2D:
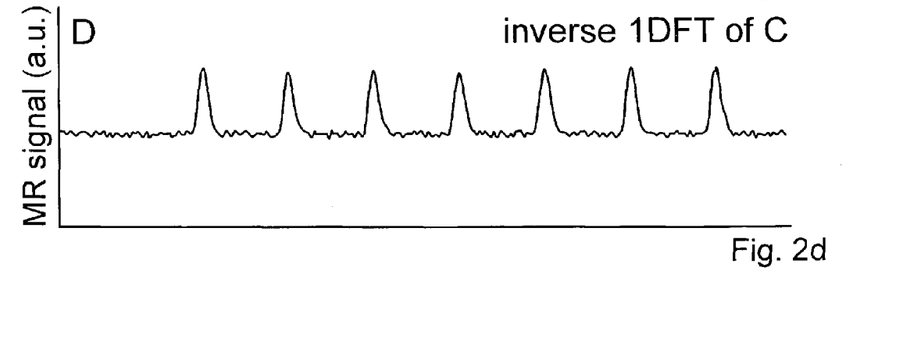

Referring to FIGS. 2a to 2d, the filtering process of a simulated image pixel time course using the method for filtering transient noise according to the invention is shown. FIG. 2a illustrates one of 529 simulated image pixel time courses. The time course shown in FIG. 2a simulates image pixel intensity as function of time for 7 repetitions of a hemodynamic response to 6 seconds of stimulation occurring at 30-second intervals. A model of the hemodynamic response to this stimulus was derived from the convolution of the boxcar stimulus presentation time course—7 presentations of 6 seconds ON, 24 seconds OFF—with an ideal hemodynamic response function (HRF) for a 1-second stimulus. Zero-mean Gaussian noise was added to each time-course to simulate real responses. High frequency artifacts have been added at two chosen time intervals within each time course. FIG. 2b illustrates the Stockwell frequency/time spectrum for the time course shown in FIG. 2a. The white areas in the ST spectrum indicate the presence of high frequency artifacts in the time-varying signal. The artifacts are filtered from the spectrum by replacing the magnitude of the white areas with the median of the frequency's occurrence over time, as shown in FIG. 2c. After summing each frequency component over all time indices of the ST spectrum and application of one-dimensional inverse FT a resulting filtered time course is obtained as shown in FIG. 2d. The method for filtering transient noise according to the invention is highly advantageous by easily identifying high-frequency artifacts within the ST spectrum and filtering only frequency components near the artifacts. Therefore, high-frequency artifacts are substantially removed while the frequency content of the remaining signal is preserved, enabling for example detection of subtle frequency changes occurring over time.

Figure 3:
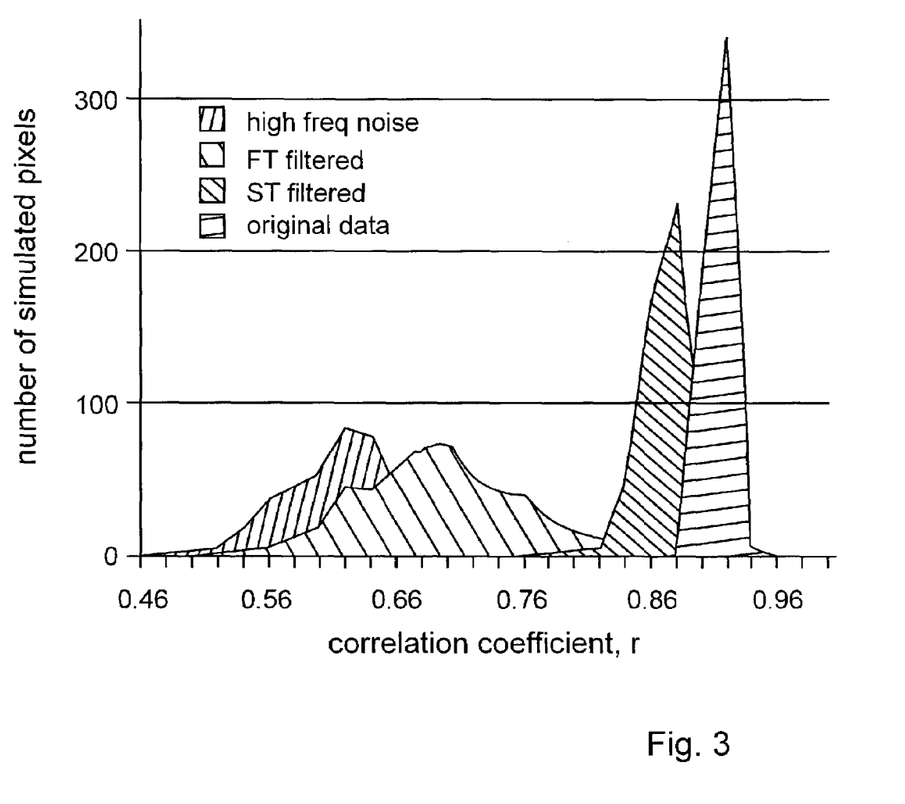
FIG. 3 illustrates histograms of pixel cross correlation coefficients resulting from cross correlation of image pixel intensity time courses with a hemodynamic response function.

Once the 529 simulated time courses are generated, each resulting time course is cross-correlated with the expected hemodynamic response model—similar to a typical fMRI analysis. This analysis was performed on the simulated time courses before the high-frequency noise was added, after the high-frequency noise was added, after low-pass FT filtering of the high-frequency noise, and after ST filtering without low-pass filtering. The results are illustrated in the form of histograms of pixel cross-correlation coefficients r, shown in FIG. 3. The distribution at the far right represents the cross-correlation for the time courses before addition of the high-frequency noise. The other distributions are from the left: the distribution after high-frequency noise was added, after low-pass FT filtering of the high-frequency noise, and after ST filtering of the high-frequency noise. As expected, the cross-correlation coefficient of each time course decreased after introducing high-frequency noise. Low-pass FT filtering increased the cross-correlation coefficients, however, this method indiscriminately removed high frequencies from the entire time course and shifted the cross-correlation distribution to larger values. Filtering according to the invention using the ST removed unwanted frequencies only at artifact locations and maintained the frequency content of the signal elsewhere. Therefore, the cross-correlation increased significantly and the distribution regained the shape of the original artifact free distribution.

Figure 4A:
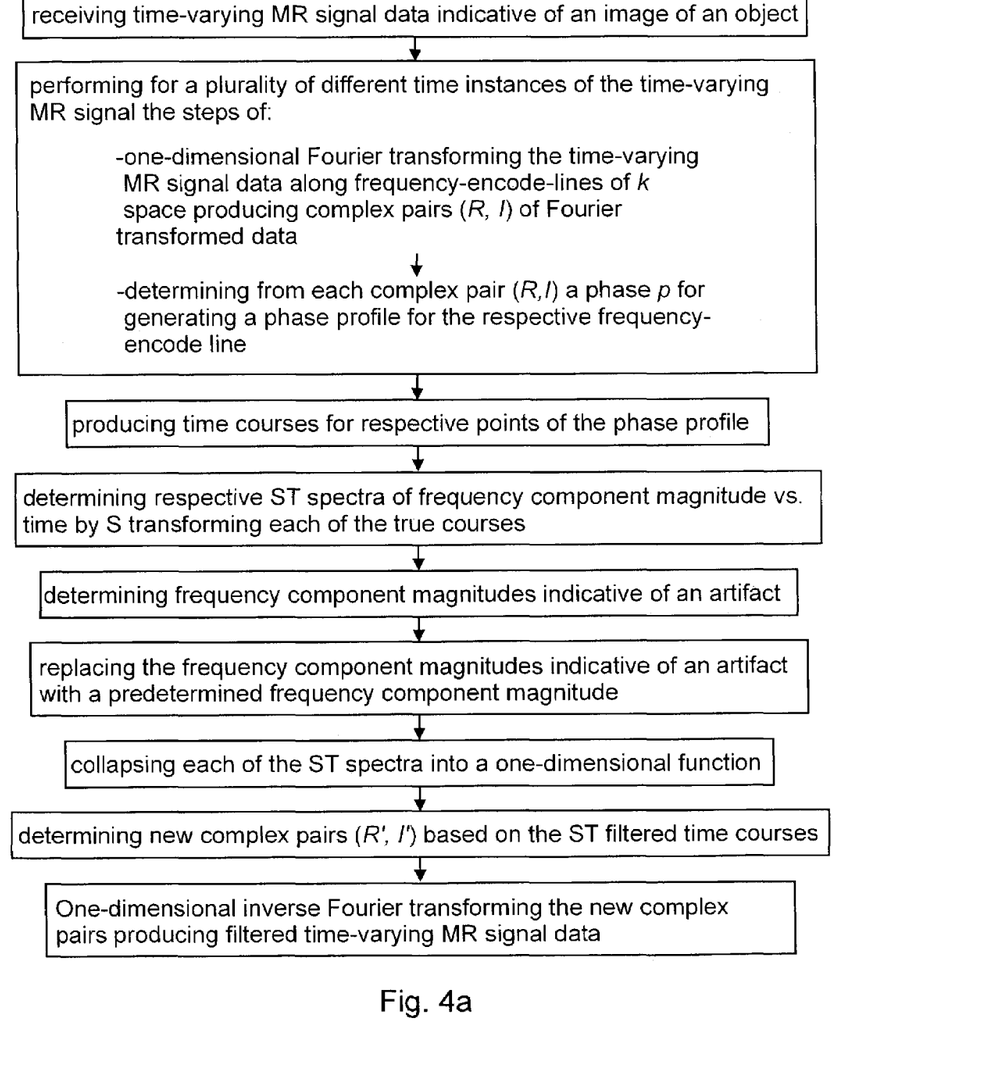
FIG. 4a is a simplified flow diagram of a method for filtering time-varying MR signal data according to the invention.

Referring to FIG. 4a, another embodiment of a method for filtering transient noise according to the invention is shown. A one-dimensional FT is applied to time-varying MR signal data along each frequency-encode line of k space. The phase p of each complex pair (R, I) of the FT transformed data is calculated to create a phase profile for each frequency-encode line. This process is repeated for all time points of the time-varying MR signal data. The time course of each point within the phase profile is then ST filtered according to the method shown in FIG. 1. A median magnitude of each frequency component over time including artifacts is calculated and frequency locations in time are labeled as frequency artifacts when the magnitude exceeds a predetermined threshold, for example, three times the median. After ST filtering the time courses of the filtered phase points p' are determined and new real and imaginary values (R', I') of the complex data are calculated according to:

$$R'=R \cos(p'-p)-I \sin(p'-p) \quad (3)$$

$$I'=R \sin(p'-p)+I \cos(p'-p). \quad (4)$$

The resulting phase profiles are then transformed using one-dimensional inverse FT producing filtered time-varying MR signal data which are then, for example, processed for image reconstruction.

Figure 4B:
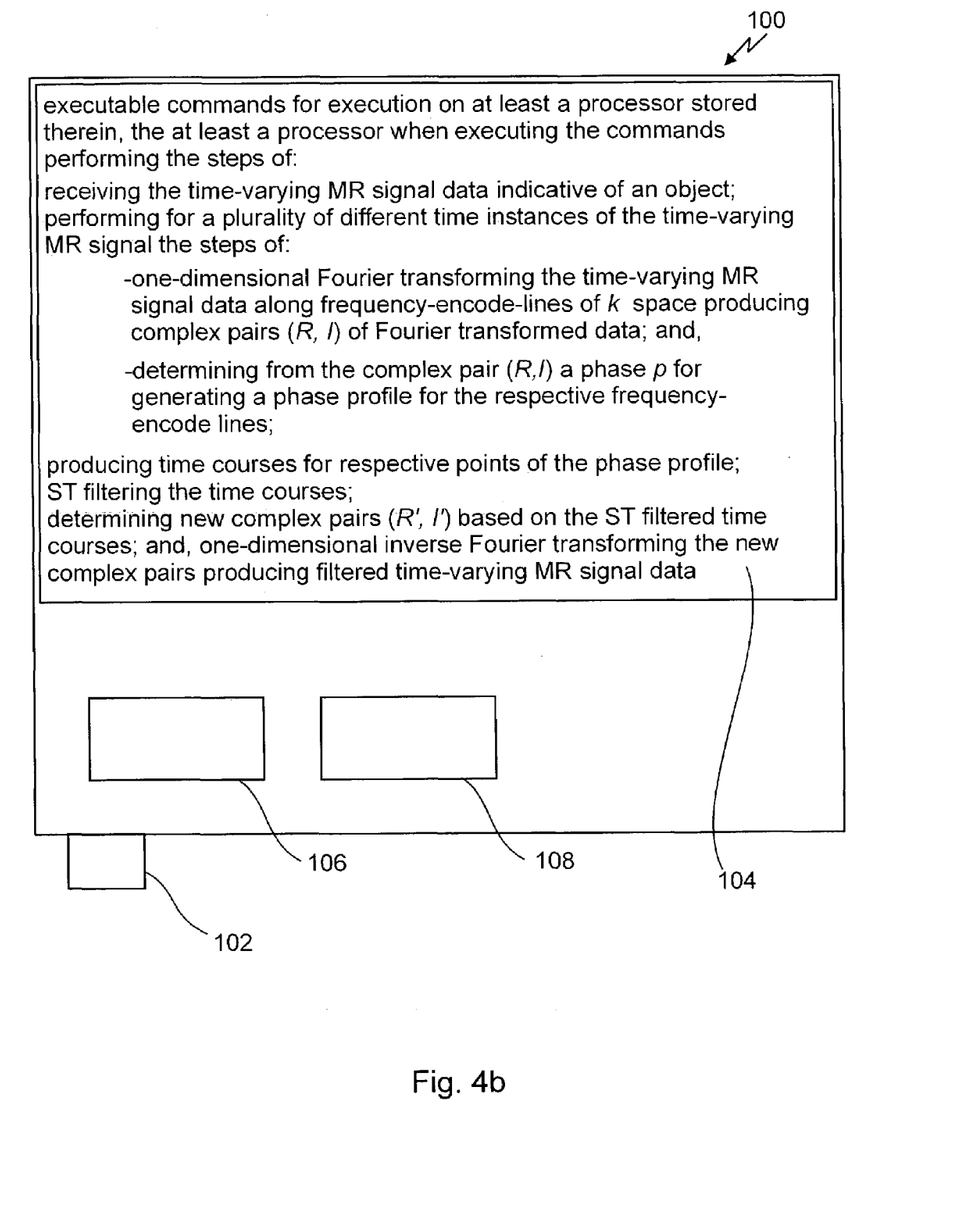

The method for filtering transient noise according to the invention is easily implemented in existing imaging systems, for example, as executable commands for execution on an existing processor for processing signal data and image reconstruction of the imaging system the commands being stored in a storage medium such as non-volatile memory accessible to the processor. Alternatively, as shown in FIG. 4b, the ST filtering is performed on a processor 106 of, for example, a workstation 100 linked to an existing MRI system via port 102 for data communication therewith. Further alternatively, the ST filtering method according to the invention is implemented using parallel processing by allocating filtering of different time courses to different processors 106, 108 and collecting the filtered time courses prior image reconstruction, thus substantially reducing computing time.

fMRI experiments were performed using a 3 Tesla MR imaging system (General Electric, Waukesha, Wis.) equipped with a quadrature birdcage RF head coil. Six healthy volunteers acted as subjects in a visual stimulation study. $T_2$*-weighted images of ten 4-mm thick slices in an oblique axial plane parallel to the calcarine sulcus were collected using a GRE-EPI sequence (TE=30 ms, TR=1000 ms, 2 interleaved segments, 22 cm FOV, 96×96 matrix). A navigator echo was collected for each segment to correct for phase fluctuations due to respiration. The phase-encode direction was chosen to be anterior-posterior such that image ghosts, if present, overlap with the visual cortex.

The subjects wore liquid crystal goggles connected to the video of a personal computer. A 6 Hz black-white contrast reversing checkerboard pattern was displayed for 6 seconds—activation phase—immediately followed by 24 seconds of a static grey screen—rest phase. This was repeated 7 times during one experimental run. During additional experiments, each subject was asked to (i) take two deep breaths, (ii) cough lightly, or (iii) talk briefly when the checker board appeared for a $2^{nd}$ time during an experimental run and when the checkerboard disappeared for a $4^{th}$ time during an experimental run. This introduced artifacts at predetermined time instances within the hemodynamic response.

Maps of activity in response to the checkerboard stimulus were created with and without ST filtering by identifying image pixels exhibiting a significant correlation, for example r>0.4, with the modeled HRF. The amount of activation—number of map pixels multiplied by each pixel's strength of correlation r—was then recorded. In total for each subject there were 8 fMRI maps: 4 conditions—deep breathing, coughing, talking, normal—and 2 data sets per condition—with ST filtering and without ST filtering. In addition, the correlation coefficients of all map pixels for the unfiltered data were compared to those of the same pixels in the ST filtered data to determine the change in correlation introduced by the ST filter.

Figure 5A:
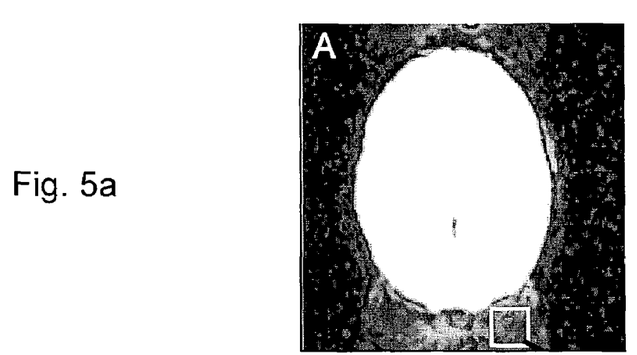
FIGS. 5a to 5c illustrate the ST filtering of a $T_2^*$-weighted fMRI image from a subject with high-frequency artifacts occurring due to coughing.
Figure 5B:
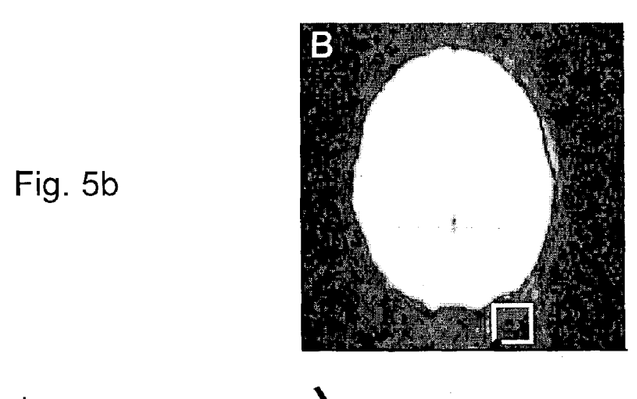
Figure 5C:
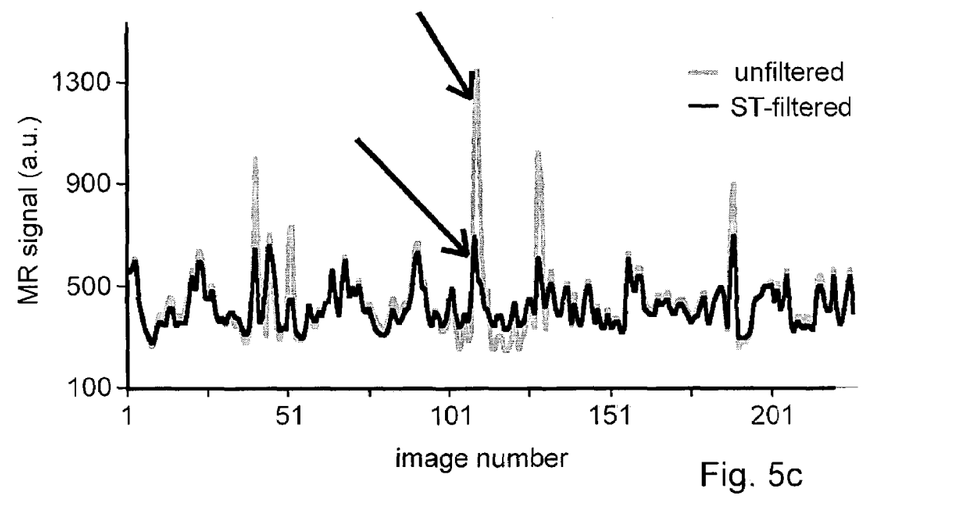

FIG. 5a shows a representative $T_2^*$-weighted fMRI image from one subject with high-frequency artifacts occurring due to coughing. The intensity of image ghosts in the image is relatively high masking the hemodynamic response. ST filtering of the fMRI signal data using the above described method according to the invention substantially reduces the intensity of the image ghosts to near baseline levels, FIG. 5b, as well as unexpected artifacts due to subject motion. FIG. 5c illustrates the removal of high-frequency artifacts using ST filtering for a time course of image pixel intensity for an image pixel inside the white boxes—indicated by arrows—shown in FIGS. 5a and 5b. As is evident, the ST filtering method according to the invention substantially improved image quality and minimized intensity fluctuations in the visual cortex.

Figure 6A:
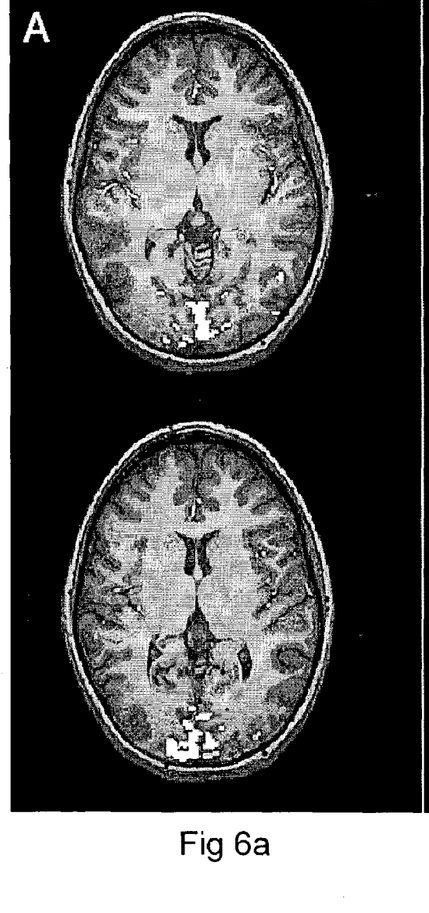
FIGS. 6a and 6b illustrate unfiltered and ST filtered fMRI maps of activity in the visual cortex of a subject in response to checkerboard stimulus; and, FIGS. 7a and 7b illustrate time courses of a false-negative and a false-positive map pixel of the fMRI maps shown in FIGS. 6a and 6b.
Figure 6B:
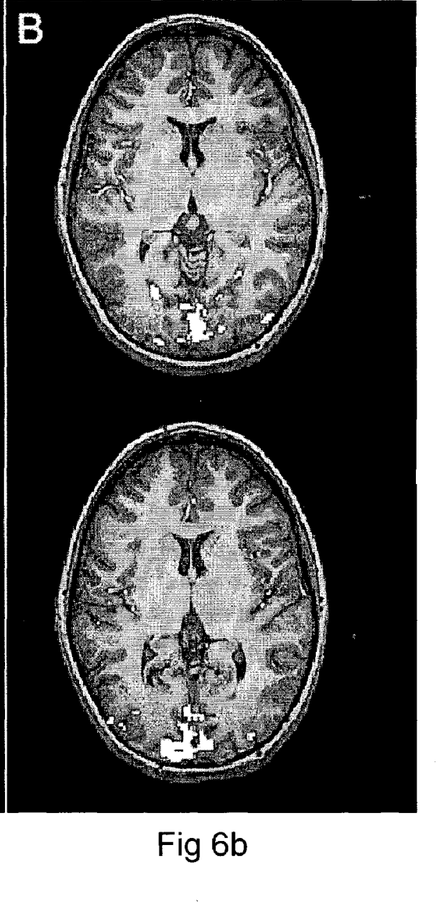
Figure 7A:
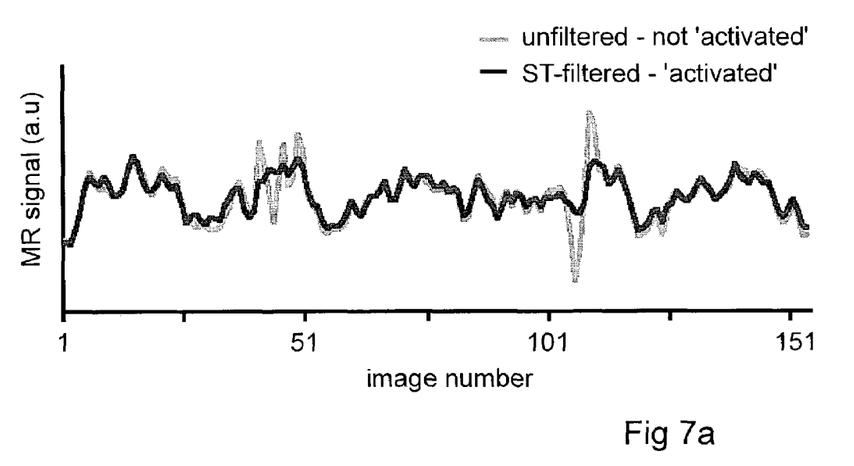
Figure 7B:
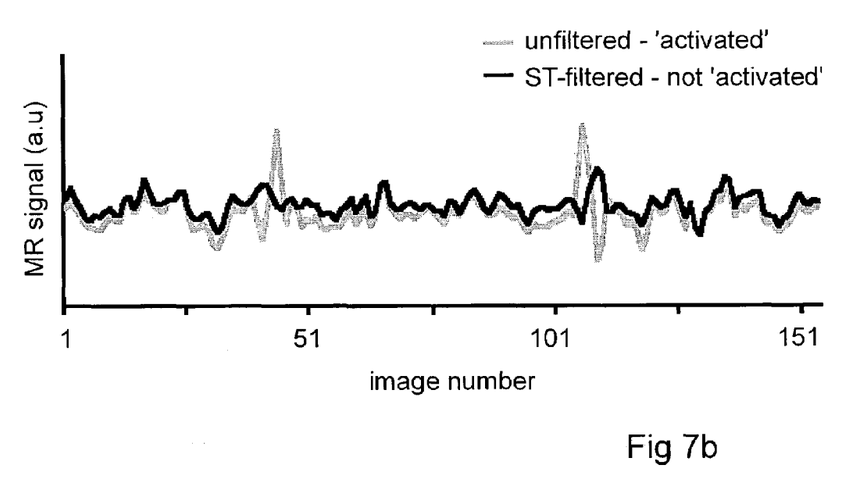

FIGS. 6a and 6b show fMRI maps of activity in the visual cortex of one subject in response to the checkerboard stimulus without ST filtering and with ST filtering, respectively. Differences between the maps in FIGS. 6a and 6b are apparent. Some map pixels have been removed by the ST filtering, while others have been added. The effect of the filter is determined by the manifestation of the artifact resulting in a large increase or decrease in the fMRI signal occurring during either the peak or the baseline of the fMRI signal. As an example, FIGS. 7a and 7b illustrate time courses of two single pixels of the images in FIGS. 6a and 6b. In FIG. 7a, the pixel was originally not a part of the map based on the unfiltered data. ST filtering removed the high-frequency artifacts, and in turn, this pixel was then determined to be significantly correlated with the visual stimulation. This demonstrates how the ST filtering allows recovering of pixels just below a statistical threshold of correlation due to the intensity fluctuations caused by the artifact. In FIG. 7b, the high-frequency artifacts in the original data produced a false-positive map pixel. The occurrence of the high-frequency artifacts during the stimulation portion biased the correlation such that it passed the statistical threshold. The ST filtering removed the artifacts, and in turn, the pixel did not pass the statistical threshold for correlation with the modeled hemodynamic response.

The fMRI experiments showed a significant effect of the ST filter for the amount of detected activation and in the change in the correlation coefficient of map pixels for the unfiltered data as illustrated in Table 1.

TABLE 1

| Condition | Significance of ST filter in altering the amount of detected activation, p | Significance of ST filter in changing r of original map pixels, p |
|---|---|---|
| breathe | 0.015 | 0.001 |
| cough | 0.049 | 0.004 |
| talk | 0.040 | 0.040 |
| normal | 0.036 | 0.020 |

The correlation coefficient of the unfiltered data decreased as a result of the ST filtering. This effect is primarily due to the location of the artifact being during times of fMRI signal peaks in response to visual stimulation. In most cases, the artifacts were manifested as a large increase in the fMRI signal superimposed on the fMRI response increasing the cross correlation coefficient. ST filtering of these artifacts reduced the signal in these areas decreasing the correlation coefficient. Correlation coefficients were increased in situations where ST filtering removed artifacts that increased the variance of the fMRI signal. It is interesting to note that the ST filter also significantly changed maps for "normal" runs when the subject was not asked to purposefully introduce noise. All subjects at times moved their head, changed breathing pattern, cleared their throat introducing MR phase fluctuations which are unpredictable and usually not monitored. The ST filter was successful in identifying and removing these artifacts.

The ST filtering method according to the invention is highly advantageous in patient fMRI studies, as patients are prone to introduce artifacts due to discomfort and restlessness.

The ST filter is further advantageous in analyses based on the strength of the fMRI response within map pixels by removing artifacts from strongly correlated pixels.

The ST filtering method according to the invention provides an automated technique for filtering unpredictable phase fluctuations from fMRI data sets and, therefore, permits fMRI in the presence of motion occurring outside the imaging field offering exploration of cortical processes with overt speech components as well as swallowing. Further, the ST filtering method improves data sets collected while a subject's hands and arms are moved near the head such as in reaching and pointing experiments.

Numerous other embodiments of the invention will be apparent to persons skilled in the are without departing from the spirit and scope of the invention as defined in the appended claims.

What is claimed is:

1. A method for filtering transient noise comprising the steps of:
   receiving time-varying signal data indicative of an image of an object;
   determining a Stockwell spectrum of frequency component magnitude vs. time by Stockwell transforming the time-varying signal data;
   determining frequency locations in time where the frequency component magnitude exceeds a predetermined threshold;
   replacing the frequency component magnitude at the determined locations with a predetermined frequency component magnitude;
   collapsing the Stockwell spectrum into a lower-dimensional function producing a Fourier spectrum of the filtered time-varying signal data;
   inverse Fourier transforming the Fourier spectrum producing filtered time-varying signal data;
   determining artifact regions, wherein the artifact regions are determined as regions extending from the locations where the frequency component magnitude exceeds the predetermined threshold to locations where the frequency component magnitude approximately equals the median magnitude; and
   replacing the magnitudes of the frequency components within the artifact regions with the median magnitude of the respective frequency component.

2. A method for filtering transient noise as defined in claim 1 further comprising the step of determining a median magnitude of each frequency component over time.

3. A method for filtering transient noise as defined in claim 1 wherein the predetermined frequency component magnitude is the median magnitude of the respective frequency component.

4. A method for filtering transient noise as defined in claim 3 wherein the Stockwell spectrum is collapsed by summing the magnitude of each frequency component over time.

5. A method for filtering transient noise as defined in claim 4 wherein the predetermined threshold is three times the median magnitude.

6. A method for filtering transient noise as defined in claim 1 further comprising:
receiving a time-varying MR data indicative of an image of an object;
performing for a plurality of different time instances of the time-varying MR data:
one-dimensional Fourier transforming the time-varying MR data along frequency encode-lines of k space producing complex pairs (R, I)of Fourier transformed data; and, determining from each complex pair (R, I) a phase p for generating a phase profile for the respective frequency-encode line;
producing the time-varying signal data for respective points of the phase profile;
Stockwell filtering the time-varying signal data;
determining new complex pairs (R', I') based on the Stockwell filtered time-varying signal data; and,
one-dimensional inverse Fourier transforming the new complex pairs producing filtered time-varying MR data.

7. A method for filtering time-varying MR signal data as defined in claim 6 wherein Stockwell filtering the time-varying signal data comprises:
determining respective Stockwell spectra of frequency component magnitude vs. time by Stockwell transforming each of the time-varying signal data;
determining frequency component magnitudes indicative of an artifact; and, replacing the frequency component magnitudes indicative of an artifact with a predetermined frequency component magnitude.

8. A method for filtering transient noise as defined in claim 7 wherein the frequency component magnitudes indicative of an artifact are determined as frequency component magnitudes exceeding a predetermined threshold.

9. A method for filtering transient noise as defined in claim 8 further comprising
determining a median magnitude of each frequency component over time.

10. A method for filtering transient noise as deemed in claim 9 wherein the predetermined frequency component magnitude is the median magnitude of the respective frequency component.

11. A method for filtering transient noise as defined in claim 10 further comprising the step of determining artifact regions.

12. A method for filtering transient noise as defined in claim 11 wherein the artifact regions are determined as regions extending from the locations where the frequency component magnitude exceeds the predetermined threshold to locations where the frequency component magnitude approximately equals the median magnitude.

13. A method for filtering transient noise as defined in claim 12 further comprising:
replacing the magnitudes of the frequency components within the artifact regions with the median magnitude of the respective frequency component.

14. A method for filtering transient noise as defined in claim 7 further comprising determining time-varying signal data of filtered phases p' by inverse Fourier transforming the respective collapsed Stockwell spectra.

15. A method for filtering transient noise as defined in claim 14 further comprising:
determining new real and imaginary values (R', I') of the complex data according to:

$$R'=R\cos(p'-p)-I\sin(p'-p)$$

and $$I'=R\sin(p'-p)+I\cos(p'-p).$$

16. A method for filtering transient noise as defined in claim 14 further comprising: reconstructing images of the object based on the filtered time-varying MR data.

17. A method for filtering transient noise as defined in claim 16 further comprising:
cross-correlating the filtered time-varying MR data with model data modeling a physical occurrence within the object.

18. A method for filtering transient noise as defined in claim 17, wherein the model data are indicative of a hemodynamic response function.

19. A method for filtering transient noise comprising the steps of:
receiving time-varying signal data indicative of an image of an object;
determining a Stockwell spectrum of frequency component magnitude vs. time by Stockwell transforming the time-varying signal data;
determining frequency component magnitudes indicative of an artifact;
replacing the frequency component magnitudes indicative of an artifact with a predetermined frequency component magnitude;
collapsing the Stockwell spectrum into a lower-dimensional function producing a Fourier spectrum of the filtered time-varying signal data; and,
inverse Fourier transforming the Fourier spectrum producing filtered time-varying signal data.

20. A method for filtering transient noise as defined in claim 19 wherein the frequency component magnitudes indicative of an artifact are determined as frequency component magnitudes exceeding a predetermined threshold.

21. A method for filtering transient noise as defined in claim 20 further comprising the step of determining a median magnitude of each frequency component over time.

22. A method for filtering transient noise as defined in claim 21 wherein the predetermined frequency component magnitude is the median magnitude of the respective frequency component.

23. A system for filtering transient noise comprising a storage medium having executable commands for execution on at least a processor stored therein, the at least a processor when executing the commands performing the steps of:
receiving time-varying signal data indicative of an image of an object;
determining a Stockwell spectrum of frequency component magnitude vs. time by Stockwell transforming the time-varying signal data;
determining frequency locations in time where the frequency component magnitude exceeds a predetermined threshold;
replacing the frequency component magnitude at the determined locations with a predetermined frequency component magnitude;
collapsing the Stockwell spectrum into a lower-dimensional function producing a Fourier spectrum of the filtered time-varying signal data; and, inverse Fourier transforming the Fourier spectrum producing filtered time-varying signal data.

24. A system for filtering transient noise as defined in claim 23 further comprising:
a port for receiving the time-varying signal data; and,
at least a processor in data communication with the port and the storage medium, the processor for executing the executable commands for processing the time-varying signal data.

25. A system for filtering transient noise as defined in claim 24 wherein the at least a processor comprises a plurality of processors and wherein the plurality of processors is used for processing a plurality of the time courses in parallel.

26. A system for filtering transient noise as defined in claim 23 wherein the at
least a processor performs:
receiving time-varying MR data indicative of an image of an object;
performing for a plurality of different time instances of the time-varying MR data the steps of:
one-dimensional Fourier transforming the time-varying MR data along frequency-encode-lines of k space producing complex pairs (R, I) of
Fourier transformed data; and,
determining from the complex pairs (R, I) a phase profile for the respective frequency-encode lines;
producing the time-varying signal data for respective points of the phase profile; determining a Stockwell spectrum of frequency component magnitude vs. time by
Stockwell transforming the time-varying signal data;
determining frequency component magnitudes indicative of a artifact;
replacing the frequency component magnitudes indicative of an artifact with a predetermined frequency component magnitude;
determining new complex pairs (R',I') based on the Stockwell filtered time-varying signal data; and,
one-dimensional inverse Fourier transforming the new complex pairs producing filtered time-varying MR data.

* * * * *